United States Patent
Fidelis et al.

(10) Patent No.: US 7,598,876 B2
(45) Date of Patent: Oct. 6, 2009

(54) METHOD FOR MANUFACTURING A RFID ELECTRONIC TAG

(75) Inventors: Sylvain Fidelis, Austin, TX (US); Pierre Rizzo, Aix En Provence (FR)

(73) Assignees: STMicroelectronics SA, Montrouge (FR); STMicroelectronics Inc., Carrollton, TX (US)

( * ) Notice: Subject to any disclaimer, the term of this patent is extended or adjusted under 35 U.S.C. 154(b) by 485 days.

(21) Appl. No.: 11/385,458

(22) Filed: Mar. 21, 2006

(65) Prior Publication Data

US 2007/0222613 A1    Sep. 27, 2007

(51) Int. Cl.
*G08B 13/14* (2006.01)

(52) U.S. Cl. ............ 340/572.8; 340/572.1; 340/572.4; 340/572.7; 235/380; 235/382; 235/491; 235/492

(58) Field of Classification Search ............ 340/572.8, 340/572.1, 572.4, 572.7; 235/491, 492, 380, 235/382

See application file for complete search history.

(56) References Cited

U.S. PATENT DOCUMENTS 6,574,166 B2    6/2003  Niemiec ............ 368/10

| 2004/0005418 | A1 | 1/2004 | Schmid et al. ............ 428/34.1 |
| 2006/0038286 | A1 | 2/2006 | Maier et al. ............ 257/724 |
| 2006/0202830 | A1* | 9/2006 | Scharfeld et al. ......... 340/572.7 |
| 2007/0046466 | A1* | 3/2007 | Sakama et al. ........... 340/572.1 |

FOREIGN PATENT DOCUMENTS

EP    1758050    2/2007
WO    2006/002667    1/2006

OTHER PUBLICATIONS

Karjoth et al., Disabling RFID Tags with Visible Confirmation: Clipped Tags Are Silenced, Aug. 31, 2005.

* cited by examiner

*Primary Examiner*—Tai T Nguyen
(74) *Attorney, Agent, or Firm*—Lisa K. Jorgenson; Allen, Dyer, Doppelt, Milbrath & Gilchrist, P.A.

(57) ABSTRACT

A method for manufacturing an electronic tag to be affixed onto a product includes providing, in an electrically conductive film of a foil for packaging, packing or transporting the product, areas devoid of any electrically conductive material for delimiting in the electrically conductive film at least one antenna pattern for forming an antenna for an RFID tag. A semiconductor chip is connected to the antenna for forming an electronic tag.

22 Claims, 9 Drawing Sheets

METHOD FOR MANUFACTURING A RFID ELECTRONIC TAG

FIELD OF THE INVENTION

The present invention relates to the production of RFID (Radio Frequency Identification) electronic tags.

BACKGROUND OF THE INVENTION

RFID electronic tags are produced by passive contactless integrated circuits, or transponders, which can be of the electrical coupling-type or the inductive coupling-type.

Electrical coupling contactless integrated circuits, or UHF contactless integrated circuits, are electrically powered by a UHF electric field oscillating at several hundred MHz. They send data by modulating the reflection rate of their antenna circuit (a technique called backscattering). Such integrated circuits are, for example, described by the industrial specification EPCTM-GEN2 (Radio-Frequency Identity Protocols Class-1 Generation-2—UHF RFID Protocol for Communications at 860 MHz-960 MHz), which is in the process of being standardized. They are generally used in so-called long range applications, in which the distance between the integrated circuit and a data send/receive station sending the electric field, commonly called a reader, can reach several meters.

Inductive coupling contactless integrated circuits, or RF contactless integrated circuits, send data by load modulation and are powered by inductive coupling in the presence of a magnetic field. The frequency of which is generally on the order of approximately ten MHz. Such integrated circuits are, for example, described by standards ISO/IEC 14443A/B, ISO/IEC 15693 that provide for a working frequency of 13.56 MHz.

Figure 1:
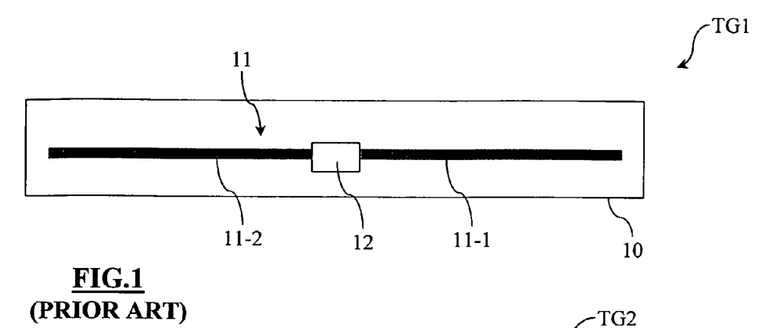
FIGS. 1 and 2 respectively represent RF and UHF electronic tags according to the prior art.

FIG. 1 schematically represents a UHF-type electronic tag TG1. The electronic tag TG1 comprises a substrate 10, a UHF dipole antenna 11 comprising two antenna wires 11-1, 11-2, and a UHF integrated circuit 12 having two contact pads connected to the antenna wires 11-1, 11-2.

Figure 2:
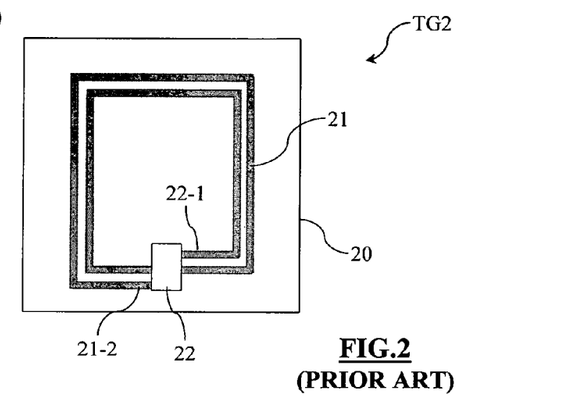

FIG. 2 schematically represents an RF-type electronic tag TG2. The electronic tag TG2 comprises a substrate 20, an antenna 21 in the form of a coil comprising two windings for example, and an RF integrated circuit 22 having two contact pads connected to the ends 21-1, 21-2 of the antenna coil.

The substrate 10, 20 can be a simple, flexible plastic foil (polyamide, polyester, etc.) having a self-adhesive back face, or even a simple paper substrate. The UHF dipole antenna 11 or the RF antenna coil 21 can be produced by etching a metal layer, by sticking a leadframe onto the medium, and by depositing a conductive ink (screen printing or inkjet), etc. The antenna 11 or 21 is also known to be produced directly on the product by depositing conductive ink on one side of the product, which forms the substrate of the tag.

UHF and RF electronic tags are currently used to identify and/or authenticate the products onto which they have been affixed. The contactless integrated circuit generally comprises an electrically erasable and programmable memory enabling, in addition to identification data, application data, trade data, tracing data, etc. to be saved. Numerous applications are therefore possible including product authentication (prevention of forgery or smuggling), inventory management, supply chain management (product tracking during transit), etc.

Due to the increasingly low cost of contactless integrated circuits, electronic tags will be affixed onto an increasingly significant number of products. To comply with consumer privacy requirements, it has been suggested to produce an electronic tag which can be destroyed by the buyer after purchasing the product. Since an electronic tag is generally read-accessible and write-accessible, it could indeed be used fraudulently to identify or secretly track not only the product bearing the tag but also the person having purchased the product.

Rather than taking the tag out of service by the classic KILL command which is difficult for the end user to check, physical destruction of the antenna circuit is regarded as the most reassuring approach for the consumer. The latter allows the end user to visually satisfy himself that the tag is destroyed.

The document titled "Disabling RFID Tags with visible confirmation—Clipped tags are silenced" by Gunter Karjoth (IBM Zurich Research Laboratory Ruschlikon) and Paul Moskowitz (IBM T. J. Watson Research Center Hawthorne), dated Aug. 31, 2005, Computer Science (RC23710(WO508-164)), describes various approaches for enabling the user to disable an electronic tag, such as:

1) producing all or part of the antenna on a scratch-off material, which is scratched by the user to destroy the antenna, 2) producing all or part of the antenna on a pre-cut medium, which is removed by the user with a grab tab being provided for this purpose, and 3) producing all or part of the antenna on a peel-off layer that the user also removes to disable the antenna, again by using a grab tab.

These various approaches aimed at destroying the antenna do, however, make the structure of the ready-to-fit electronic tags more complex and also increase their cost as a result.

Furthermore, U.S. Pat. No. 6,574,166 describes a method enabling the consumption of tablets arranged in a blister-type packaging to be detected and managed. According to the embodiment represented in FIG. 2 of the patent, a network of electrical conductors (108, 210) is provided in the packaging foil of the blister (foil covering the cells of the blister). The network of conductors is sandwiched between two electrically insulating plastic foils (208, 212) over which an aluminum film (104) extends. The two plastic foils and the aluminum foil form the packaging foil. When the user opens a cell of the blister to eject a tablet, he snaps one of the conductors. The snapping is detected as an open circuit by an electronic circuit connected to the network of conductors.

Similarly, the company ABR Pharma markets a so-called intelligent Med-ic® blister (www.abrpharma.com/PDF/blister.pdf), comprising a grid network of conductors produced by depositing silver- and graphite-based conductive inks on a paper substrate. The network of conductors is stuck onto the aluminum front face of the blister and is formed such that one of the conductors is destroyed when the patient extracts a tablet from a cell. The snapping of the conductor is detected by a 13.56 MHz RFID integrated circuit that retransmits the cell opening data to a reader.

This technique for detecting the consumption of tablets is based on the destruction of conductors incorporated into the packaging foil of the blister, but is not destructive for the antenna circuit since the RFID integrated circuit linked to the network of conductors continues to exchange data with a reader to send information about the number of tablets remaining in the blister.

SUMMARY OF THE INVENTION

A first principle of the present invention, which is related to the teachings of U.S. Pat. No. 6,574,166 but does not result from the latter in an obvious manner, is to produce an RF or UHF tag antenna in the very packaging of a product, so that the tag is destroyed when the product is opened, or is at least thrown away when the packaging is removed from the product.

The technique disclosed in the '166 patent to produce the conductors for detecting the opening of the cells of the blister requires providing two layers of insulating material to prevent the top aluminum layer of the packaging foil of the blister from short-circuiting the network of conductors. This technique is expensive and cannot be chosen to produce a low-cost antenna integrated into a packaging foil. The cost of the ready-to-fit tags thus remain more attractive.

An object of the present invention is to provide a method enabling an electronic tag to be produced at low cost that can optionally be destroyed when the packaging enclosing the tag is opened.

For this purpose, the metal or electrically conductive parts of a material for packaging, packing or transporting a product may be used to produce an RF or UHF antenna by removing metal or conductive material so as to reveal an antenna pattern.

The present invention is particularly based on the principle of using the metal film of a blister packaging foil to form an RF or UHF antenna by removing a portion of the metal material so as to provide an antenna pattern.

According to the present invention, this principle extends to any type of product other than a blister for which a packaging, packing or transport foil comprising a metal film is used. The antenna pattern can be formed by etching the metal material or by removing the latter by a mechanical method (abrasion, cutting, etc.).

Thus, the present invention provides a method for manufacturing an electronic tag intended to be affixed onto a product, comprising the steps of providing in an electrically conductive film of a foil for packaging, packing or transporting the product, areas devoid of any conductive material delimiting in the conductive film at least one antenna pattern forming an antenna for an RFID tag. The conductive film may not be covered on one of its sides by an electrically insulating film. The method may further comprise connecting to the antenna a chip in semi-conductive material for forming an electronic tag together with the antenna.

According to one embodiment, the packaging, packing or transport foil may comprise at least one electrically insulating backing film covered in whole or in part by the conductive film.

According to one embodiment, the step of providing areas devoid of any conductive material may comprise a step of abrading or cutting the conductive film.

According to one embodiment, the step of abrading or cutting the conductive film may be carried out after application of the packaging, packing or transport foil to the product, and the method may comprise a step of providing grooves on one side of the product opposite the areas where the conductive material is to be removed by abrasion or cutting.

According to one embodiment, the step of providing areas devoid of any conductive material may comprise a step of etching the conductive film.

According to one embodiment, the product is a blister-type strip and the packaging, packing or transport foil may be applied to one side of the strip with the conductive film facing outwards.

According to one embodiment, the conductive film may be a metal film.

The present invention also relates to a method for manufacturing blister-type packaging, comprising a step of manufacturing a strip in plastic comprising cells, a step of manufacturing a packaging foil comprising at least one electrically insulating backing film and a metal film covering all or part of the backing film, and a step of closing the cells by applying the packaging foil to the strip with the metal film facing outwards. The method may further comprise a step of providing, in the metal film, areas devoid of any metal material delimiting in the metal film at least one antenna pattern forming an antenna for RFID tag.

According to one embodiment, the step of providing areas devoid of any metal material may comprise a step of abrading or cutting the metal film carried out after the closing of the cells.

According to one embodiment, the method may comprise a step of providing grooves on the strip opposite the areas where the metal material is to be removed by abrasion or cutting.

According to one embodiment, the step of providing areas devoid of any metal material may comprise a step of etching the metal film carried out before the closing of the cells.

According to one embodiment, the method may comprise a step of connecting to the antenna a chip in semi-conductive material to form an electronic tag.

The present invention also relates to a method of packaging or packing a product by a packaging or packing foil comprising an electrically conductive film. The method may comprise a step of providing, in the conductive film, areas devoid of any conductive material delimiting in the metal film at least one antenna pattern forming an antenna for an RFID tag.

According to one embodiment, the electrically conductive film may not be covered on one of its sides by an electrically insulating film.

According to one embodiment, the packaging or packing foil may comprise at least one electrically insulating backing film covered in whole or in part by the conductive film.

According to one embodiment, the method may comprise a step of applying the packaging or packing foil to all or part of the product so that the conductive film is outside the packaging or packing.

According to one embodiment, the conductive film may be a metal film.

According to one embodiment, the step of providing areas devoid of any conductive material may comprise a step of etching the conductive film carried out before application of the packaging or packing foil to the product.

According to one embodiment, the step of providing areas devoid of any conductive material comprises a step of abrading or cutting the conductive film carried out after application of the packaging or packing foil to the product.

According to one embodiment, the method may comprise a step of connecting to the antenna a chip in semi-conductive material to form an electronic tag.

The present invention also relates to a method for manufacturing a product packaging, packing or transport foil, with the foil comprising an electrically conductive film. The method may comprise a step of providing, in the conductive film, areas devoid of any conductive material delimiting in the conductive film at least one antenna pattern forming an antenna for an RFID tag.

According to one embodiment, the electrically conductive film may not be covered on one of its sides by an electrically insulating film.

According to one embodiment, the step of providing, in the conductive film, areas devoid of any conductive material may comprise a step of etching the conductive film.

According to one embodiment, the packaging, packing or transport foil may comprise at least one electrically insulating backing film covered in whole or in part by the conductive film.

According to one embodiment, the packaging, packing or transport foil may be produced so that the conductive film is outside the foil.

According to one embodiment, the conductive film may be a metal film.

The present invention also relates to a foil for packaging, packing or transporting a product, comprising an electrically conductive film, with the conductive film comprising areas devoid of any conductive material delimiting in the conductive film at least one antenna pattern forming an antenna for an RFID tag.

According to one embodiment, the electrically conductive film may not be covered on one of its sides by an electrically insulating film.

According to one embodiment, the foil may come in the form of a cut-out strip and may comprise a repetitive antenna pattern to form several shorter packaging, packing or transport foils each comprising at least one antenna pattern.

According to one embodiment, the foil may comprise at least one electrically insulating backing film covered in whole or in part by the conductive film.

According to one embodiment, the conductive film may be outside the foil.

According to one embodiment, the conductive film may be a metal film.

The present invention also relates to a product covered in whole or in part by a packaging, packing or transport foil comprising an electrically conductive film, in which the conductive film comprises areas devoid of any conductive material delimiting in the conductive film at least one antenna pattern forming an antenna for an RFID tag.

According to one embodiment, the electrically conductive film may not be covered on one of its sides by an electrically insulating film.

According to one embodiment, the packaging, packing or transport foil may comprise at least one electrically insulating backing film covered in whole or in part by the conductive film.

According to one embodiment, the conductive film may be outside the packaging, packing or transport foil.

According to one embodiment, the conductive film may be a metal film.

According to one embodiment, the product may comprise a chip in semi-conductive material connected to the antenna and forming with it an electronic tag.

BRIEF DESCRIPTION OF THE DRAWINGS

These and other objects, advantages and features of the present invention shall be presented in greater detail in the following description of the method according to the present invention and of examples of antennas produced according to this method, given in relation with, but not limited to the following figures, in which.

DETAILED DESCRIPTION OF THE PREFERRED EMBODIMENTS

As indicated above, the present invention is based on the straightforward principle that the aluminum film of the packaging foils, particularly those used to cover the blisters, can be used to form an RF or UHF antenna by removing metal material from appropriate areas so as to provide an antenna pattern.

Figure 3A:
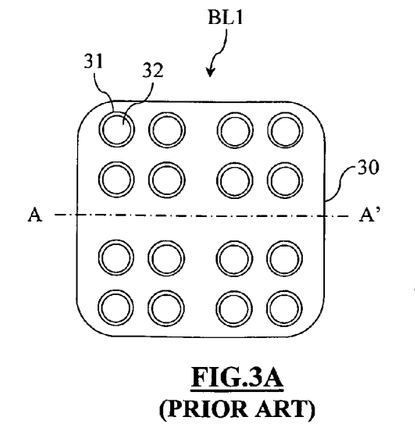
FIGS. 3A and 3B represent a blister according to the prior art, respectively by a top view and a cross section.

FIG. 3A represents a classic blister BL1 viewed from above before being closed. At this stage, the blister is a thermoformed strip 30 comprising cells 31 receiving tablets 32. After insertion of the tablets 32, the strip is closed by a foil with metal film that will be designated as a "packaging foil." The present invention does not draw a difference between the packaging foils used to fully pack a product and the packaging foils applied to one side or one part of a product to close it.

Figure 3B:
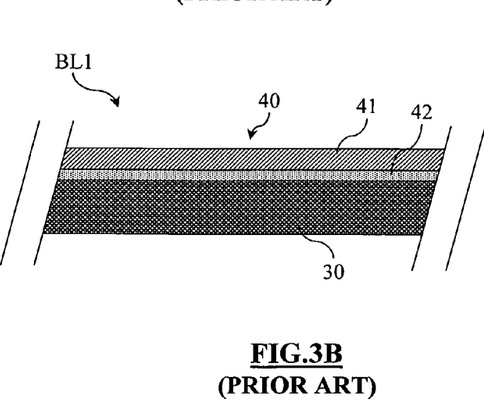

The packaging foil is represented in cross-section in FIG. 3B, along a cross-sectional axis AA' represented in FIG. 3A, and is designated by the reference 40. It comprises an aluminum film 41 and a plastic film 42, such as copolymer vinyl for example, which enables the aluminum film 41 to be fixed onto the strip 30 and is thus in contact with the tablets. The foil 40 is generally hot fixed onto the strip 30 by melting the film 42 so that it sticks to the strip 30 (heat welding).

Figure 4A:
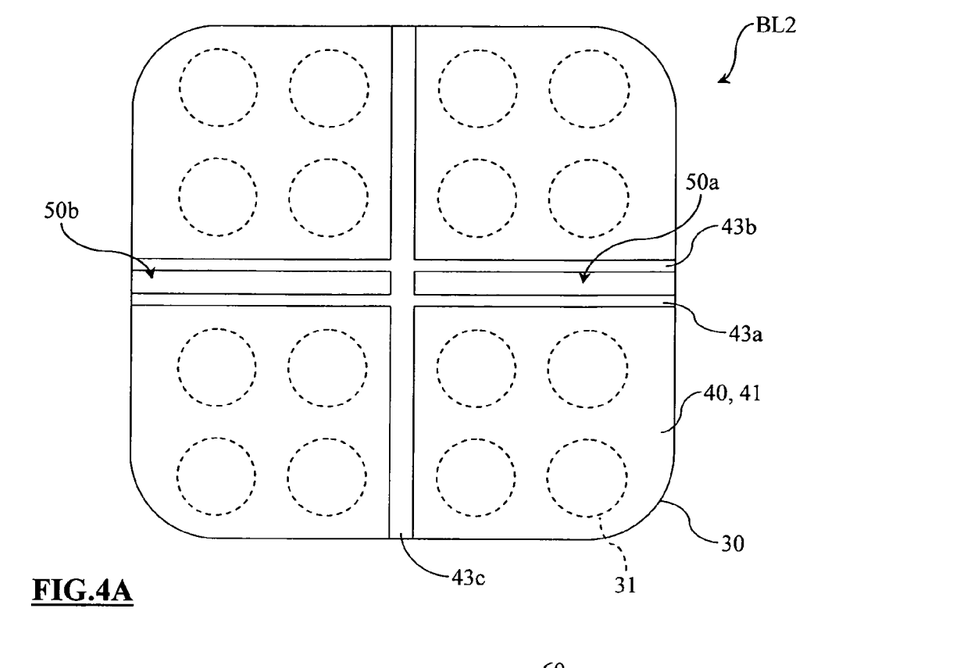
FIG. 4A is a top view of a blister comprising a UHF antenna according to the present invention.

FIG. 4A is a top view of a blister BL2 according to the present invention. The blister comprises the strip 30 already described and its thermoformed cells 31 (in dotted lines) covered by the foil 40. The aluminum film 41 extends over the front face of the blister. According to the present invention, the film 41 comprises areas devoid of any metal material. In the illustrated example, these areas are the two straight and parallel areas 43*a*, 43*b* passing through the center of the blister and a straight area 43*c* perpendicular to the areas 43*a*, 43*b* and also passing through the center of the blister. On the surface of the blister, the areas 43*a*, 43*b*, 43*c* and their intersections provide two metal bands 50*a*, 50*b* electrically insulated from the rest of the film 41. These two metal bands form the two antenna wires of a dipole antenna or UHF antenna that can be used to produce an electronic tag.

Figure 4B:
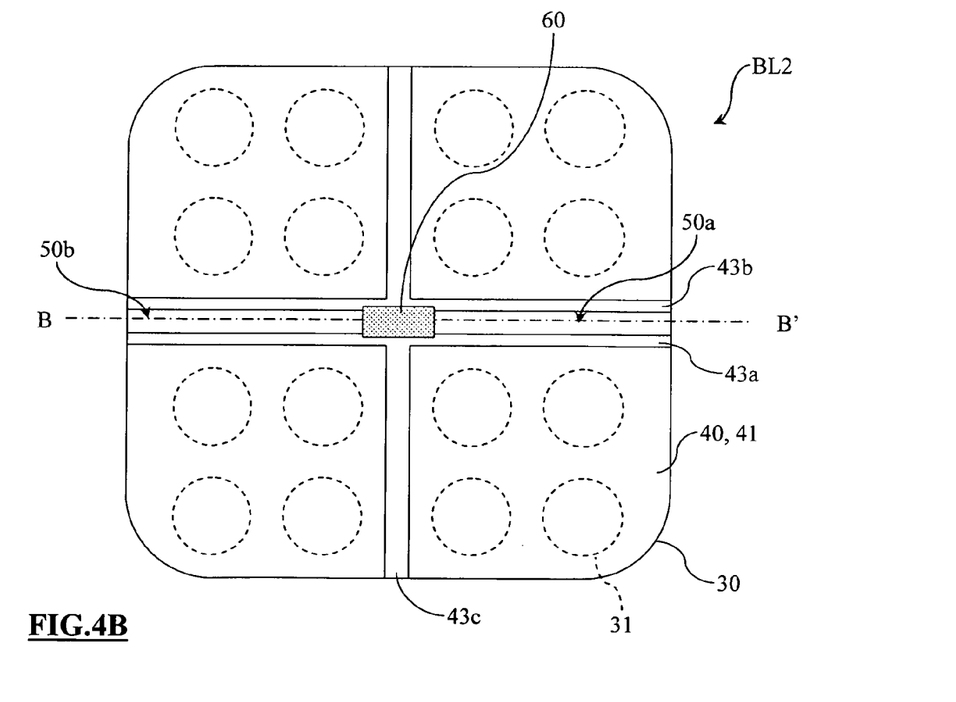
FIG. 4B is a top view of the blister in FIG. 4A after a contactless integrated circuit has been mounted and connected to the antenna.

The electronic tag is produced as represented in FIG. 4B, by disposing on the film 41*a* contactless integrated circuit 60 in the form of a semi-conductor chip having contact pads connected to the antenna wires 50*a*, 50*b*.

Figure 5:
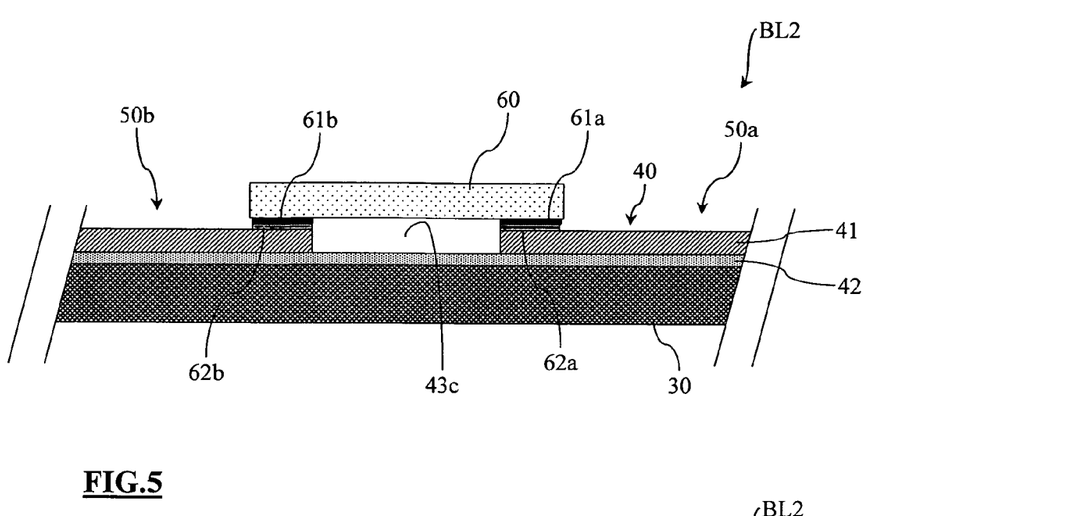
FIGS. 5 and 6 are cross-sections representing two modes of mounting and connecting the integrated circuit to the antenna in FIG. 4A.
Figure 6:
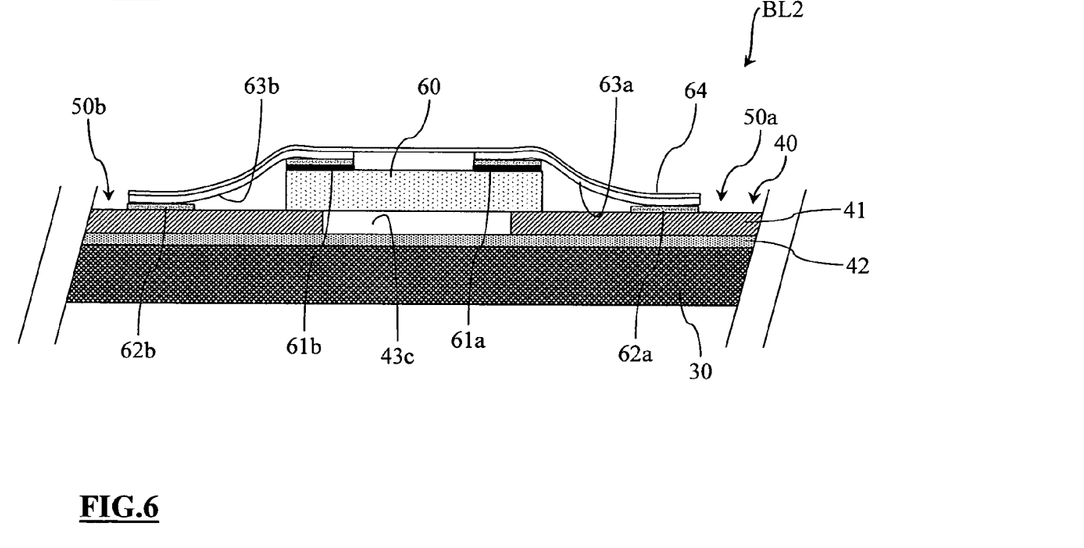

FIGS. 5 and 6 are cross-sections of the blister according to an axis BB' represented in FIG. 4B, and represent two examples of mounting the chip 60.

In FIG. 5, the chip 60 is mounted according to the flip-chip technique and has two contact pads 61*a*, 61*b* which are stuck onto the proximal ends of the antenna wires 50*a*, 50*b* by a conductive glue 62*a*, 62*b*. Such a conductive glue is widely used in microelectronics and generally comprises a metal-loaded polymer.

In FIG. 6, an assembly ready to be mounted onto the antenna, called an interposer, has previously been produced by welding onto the contact pads 61*a*, 61*b* of the chip 60 metal rectangles 63*a*, 63*b* pre-cut on a metal band (leadframe technique), forming electrical pins. The material constituting the metal rectangles is compatible with the metal film used to produce the antenna according to the present invention, and is therefore, preferably, in aluminum. The back face of the chip 60 is covered with an electrically insulating material and rests on the proximal ends of the antenna wires 50*a*, 50*b*, with the contact pads 61*a*, 61*b* facing upwards. The distal ends of the metal rectangles 63*a*, 63*b* are folded down and stuck onto the proximal ends of the antenna wires 50*a*, 50*b* by a conductive glue 62*a*, 62*b*. The upper face of the interposer is covered by an electrically insulating protective layer 64.

Two methods enabling metal material to be removed from the aluminum film 41 to provide an antenna such as the one described above will now be described. The first method is a method for removing material by mechanical action on the film 41 and is implemented after closing the blister (i.e., after applying the packaging foil 40 to the blister). The second method is implemented by chemical action on the packaging foil 40 before closing the blister.

Figure 7A:
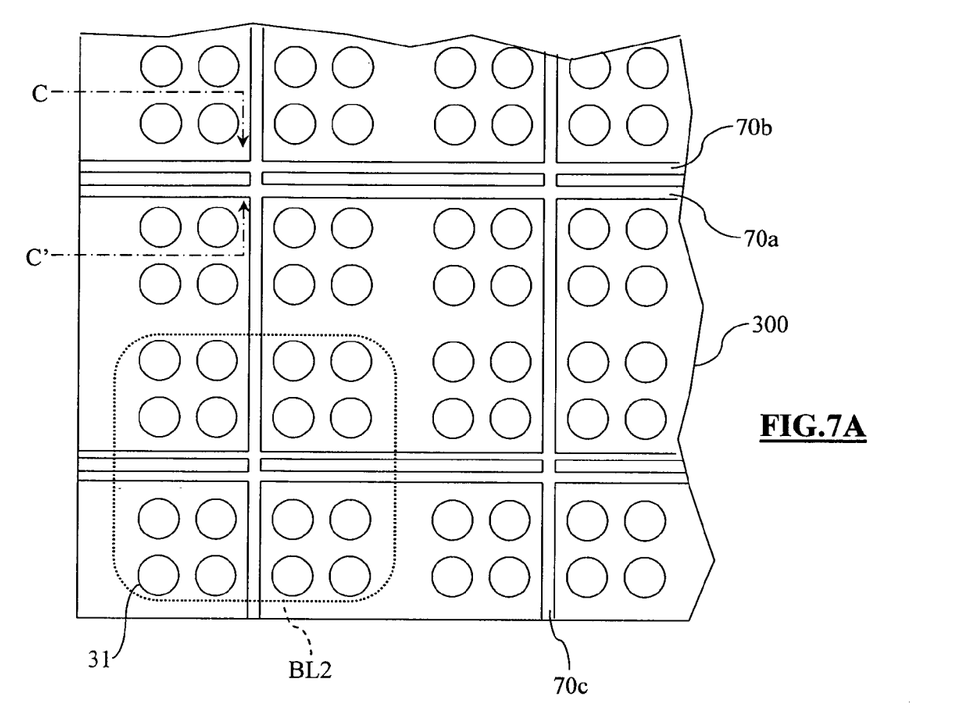
FIG. 7A is a top view of a blister strip being formed showing a step of manufacturing a blister according to the present invention.

As shown in FIG. 7A, the first method preferably comprises a preliminary step of forming grooves 70*a*, 70*b*, 70*c* on the surface of a blister strip. The blister BL2 represented in this figure is manufactured collectively using a large plastic sheet 300 which is thermoformed so as to simultaneously form the grooves 70*a*, 70*b*, 70*c* and the cells of several blisters. These are individualized by cutting the sheet 300 at the end of the process, after the tablets have been inserted. The sheet 300 is closed and an antenna is produced on each blister. The grooves 70*a*, 70*b*, 70*c* are arranged so as to extend under the areas where the metal material is to be removed. They therefore correspond to the areas 43*a*, 43*b*, 43*c* devoid of any metal material represented in FIGS. 4A, 4B. The grooves 70*a*, 70*b* are straight and parallel, and the groove 70*c* is straight and perpendicular to the grooves 70*a*, 70*b*. The grooves 70*a*, 70*b*, 70*c* are produced on the sheet 300 in a repetitive pattern (according to the number of individual blisters to be produced) and cross the entire surface of the sheet.

Figure 7B:
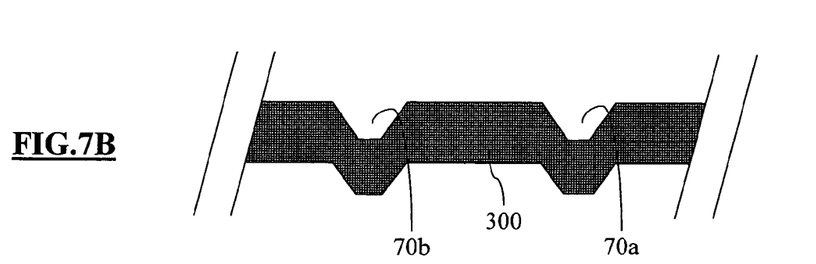
FIG. 7B is a cross-section of one part of the blister in FIG. 7A.
Figure 7C:
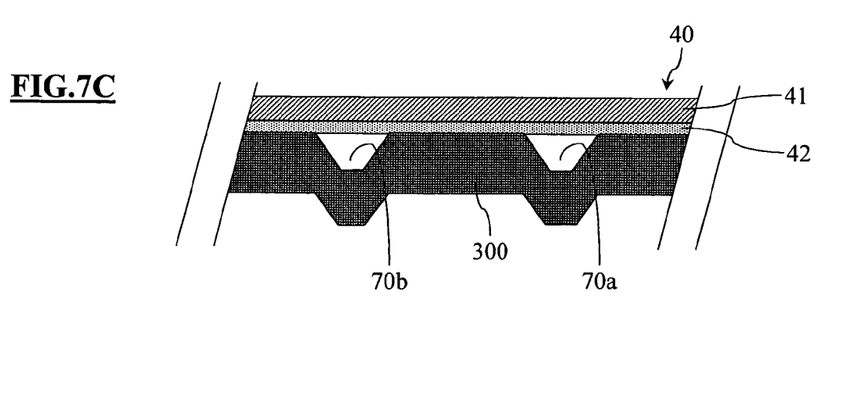
FIG. 7C is a cross-section of one part of the blister in FIG. 7A after application of a packaging foil to the blister.

FIG. 7B is a cross-section of the sheet 300 according to an axis CC' represented in FIG. 7A, that schematically represents the shape of the grooves 70*a*, 70*b*. FIG. 7C represents the same grooves after welding of the packaging foil 40 onto the sheet 300. The grooves 70*a*, 70*b* extend under the packaging foil 40 and will facilitate the removal of the metal material during a step shown in FIG. 8A.

Figure 8A:
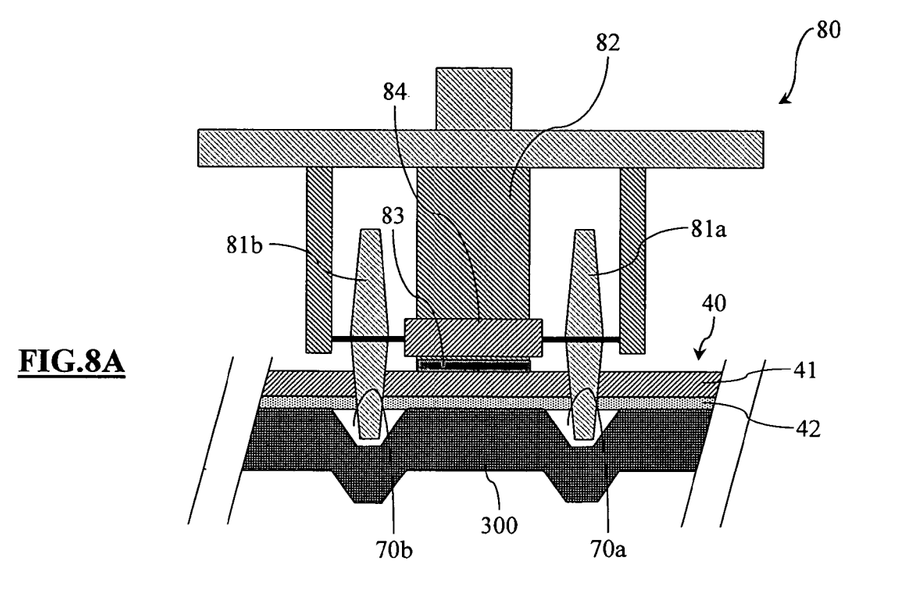
FIGS. 8A, 8B are cross-sections of the blister in FIG. 7C showing a first method for manufacturing an antenna according to the present invention.
Figure 8B:
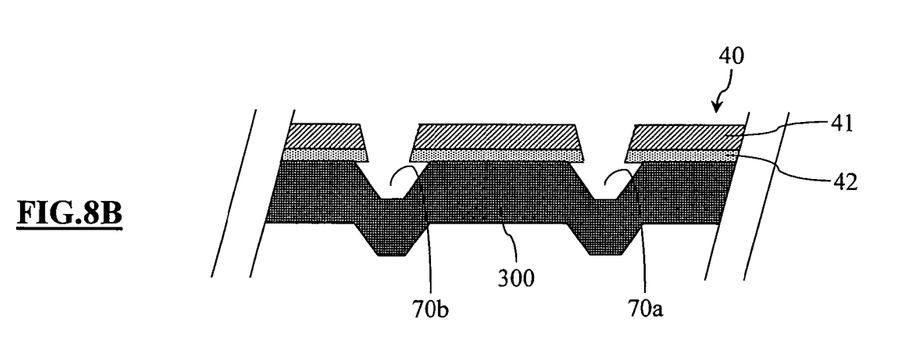

In FIG. 8A, the metal material is removed by a tool 80 comprising two cutting or abrasion wheels 81*a*, 81*b* enabling the areas 43*a*, 43*b* devoid of any metal material (FIG. 4A) to be produced. A similar tool but comprising only one cutting or abrasion wheel (not represented) is used to produce the area 43*c*. The tool 80 comprises a shoe 82, the bottom part of which is equipped with a sliding sole plate 83. The sole plate 83 is pressed onto the aluminum film 41 of the foil 40 and enables the tool to slide along the foil while material is being cut or abraded. An electric motor 84 can be provided to drive the wheels to rotate, particularly if the latter are abrasive wheels. The wheels have a profile finely sharpened in a plane perpendicular to their axis of rotation and penetrate the grooves 70*a*, 70*b* but without touching the bottom of the grooves. FIG. 8B represents in a cross-section the appearance of the packaging foil 40 after the areas 43*a*, 43*b* above the grooves 70*a*, 70*b* have been simultaneously formed.

The present invention is not limited to the production of a dipole antenna on a blister-type packaging. Generally speaking, the metal film of a packaging foil can be used to produce any kind of antenna form, and a packaging foil treated in accordance with the present invention can be used to package various products. The metal film is not necessarily in aluminum and may comprise any type of conductive metal or alloy having electrical characteristics that are satisfactory to produce antennas. The thickness of the metal film can be greater or lesser depending on the desired electrical properties of the antenna, the working frequency, and the contactless communication distance sought, etc.

Figure 9A:
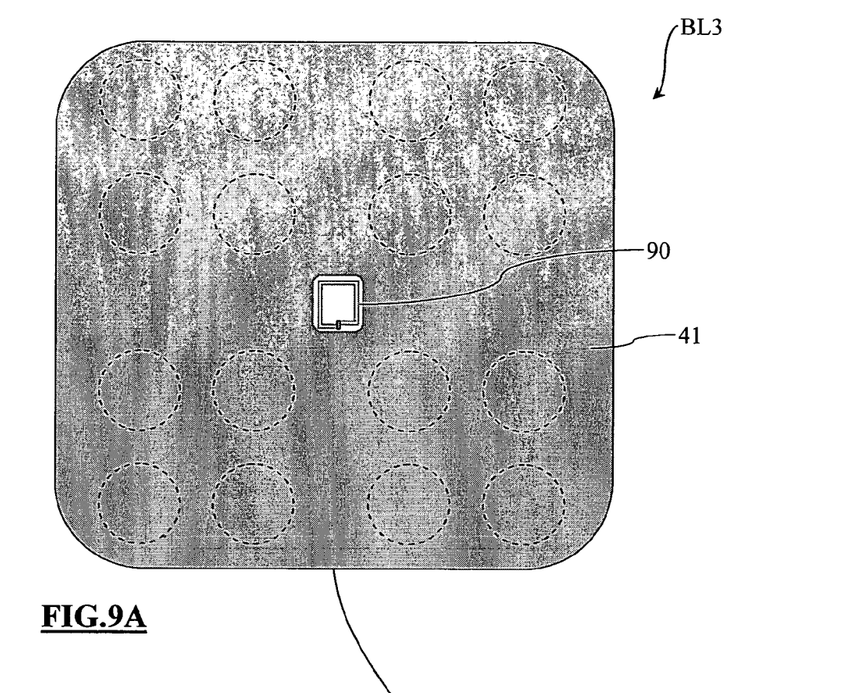
FIG. 9A is a top view of a blister comprising an antenna coil according to the present invention.

As an example, FIG. 9A represents a blister BL3. The aluminum film 41 has an antenna pattern in the shape of a coil 90, formed by removing metal material in accordance with the present invention. As shown more clearly in FIG. 9B, a contactless integrated circuit in the shape of a semi-conductor chip 60 is mounted and connected to the antenna coil 90 to form an electronic tag. The chip 60 is mounted onto the antenna 90 as described above in relation with FIGS. 5 and 6 (flip chip or interposer). The contact pads of the chip 60 are electrically linked to the two ends 90-1, 90-2 of the antenna coil 90.

Figures 9B, 10:
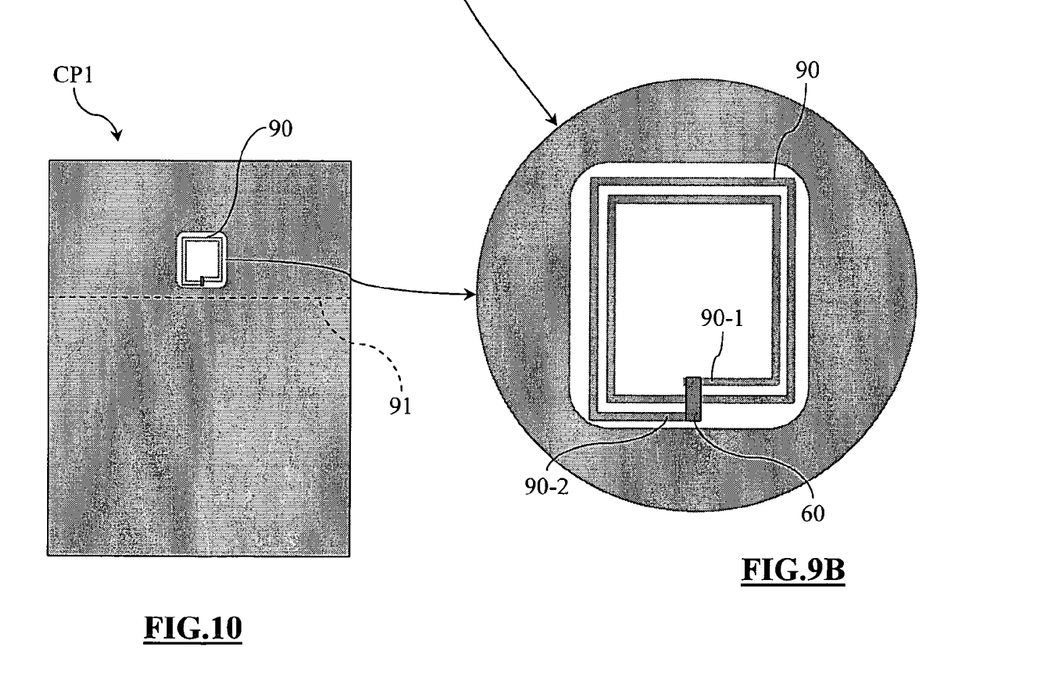
FIG. 9B is an enlarged view of the antenna coil in FIG. 9A.
FIG. 10 is a front view of a cigarette packet comprising an antenna coil conforming to the one in FIG. 9B.

In FIG. 10, the same antenna coil 90 is produced on the metal film of a packaging foil of a cigarette packet CP1. A pre-cut line 91 is provided in the packaging foil to enable the packet to be opened. This pre-cut line passes under the area where the antenna coil 90 is situated, but can also be arranged so as to pass through the antenna coil 90 so that the opening of the packet destroys it. For this purpose, pierce points of the packaging foil, forming the pre-cut line 90, should be small enough so as not to prevent the antenna coil 90 from being operational. More particularly, they should have a diameter smaller than the width of the conductor forming the antenna coil 90 (i.e., the distance between two areas devoid of any metal material).

The antenna coil 90 is preferably produced by chemically etching the packaging foil before packaging the product, by the second method according to the present invention.

Figure 11:
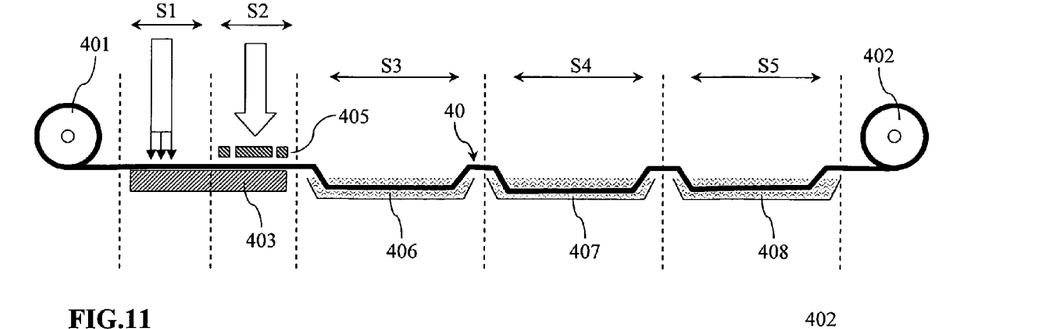
FIG. 11 schematically shows a second method for manufacturing an antenna according to the present invention.
Figure 13A:
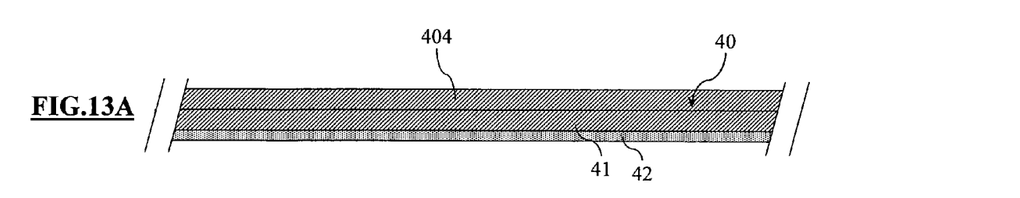
FIGS. 13A to 13D are cross-sections of the packaging foil during steps of forming the antenna according to the method shown in FIG. 11.
Figure 13B:
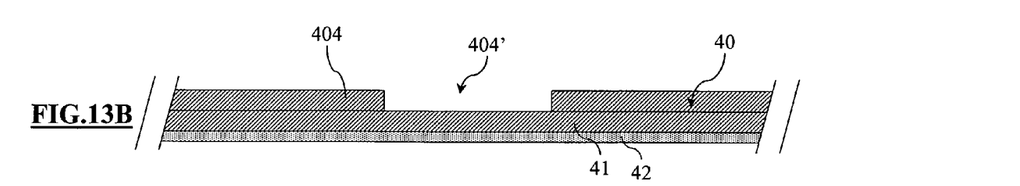
Figure 13C:
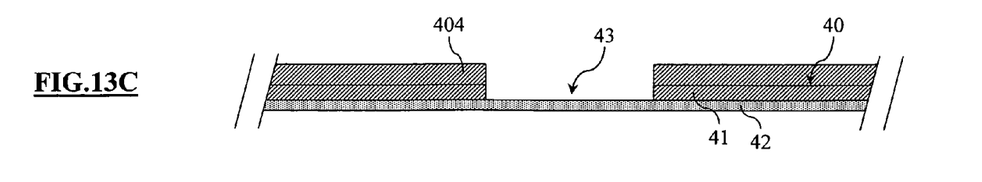
Figure 13D:
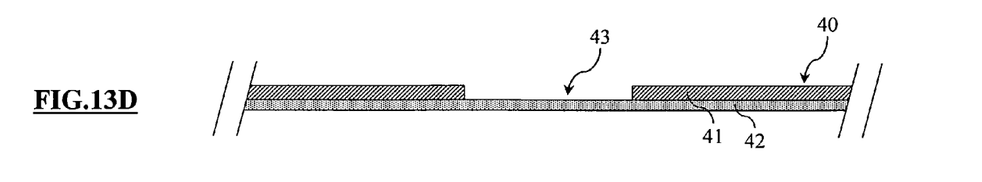

This method is shown in FIGS. 11 and 13A to 13D. The packaging foil 40 is prepared in the shape of a roll 401 and the etching process is implemented by unwinding the foil 40 over a certain length and by gradually forming a final roll 402 at its end. The roll 401 is the initial roll. Five steps of treatment S1 to S5 are applied to the foil 40:

step S1: the foil 40 passes over a support plate 403 and its front face (aluminum film 41) receives a layer of masking resist 404, preferably a positive photoresist, as shown in FIGS. 11 and 13A;

step S2: with the foil 40 still on the support plate 403, the resist 404 is insolated through an insolation mask 405 which comprises openings at the locations where metal material is to be removed from the aluminum film 41;

step S3: the foil 40 passes in a tray 406 comprising a selective solvent that dissolves the resist 404 in the regions that have been insolated to obtain openings 404' represented in FIG. 13B;

step S4: the foil 40 passes in a tray 407 comprising a selective solvent that dissolves the aluminum film 41 in the areas where the openings 404' extend to obtain areas 43 without any metal material, represented in FIG. 13C; and step S5: the foil 40 passes in a tray 408 comprising a selective solvent that dissolves the resist mask 404, as represented in FIG. 13D.

These steps are carried out in parallel on different parts of the foil 40 that are preferably of the same length. The longest step determines the time to be respected between two operations of unwinding the foil 40 from the roll 401 and the corresponding winding of the foil onto the roll 402. Additional steps of rinsing and drying the foil 40, not represented, can be provided.

Figure 12:
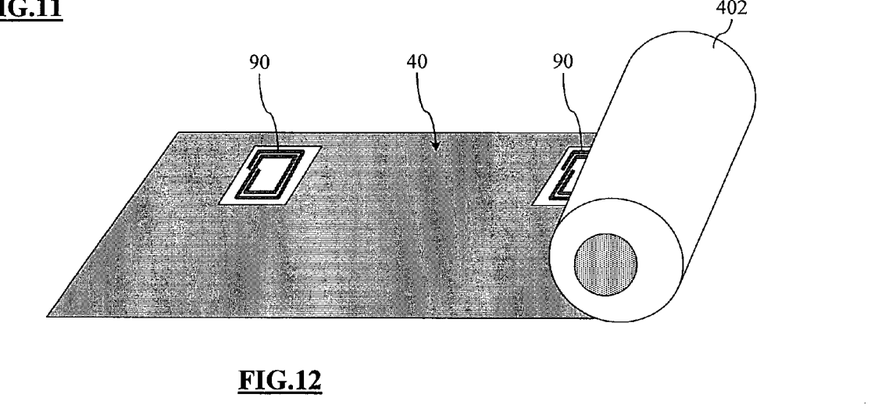
FIG. 12 represents a packaging foil after implementation of the second method and packed in the form of a roll.

FIG. 12 represents the final roll 402, with a part of the foil 40 being unwound to show the result obtained with the method of the present invention. The foil 40 has repetitive areas where an antenna pattern has been formed. The antenna pattern is in the shape of a coil 90 as described above. The distance between each antenna pattern is defined depending on the intended purpose of the roll (dimensions of the item to be packaged).

Figures 14A, 14B:
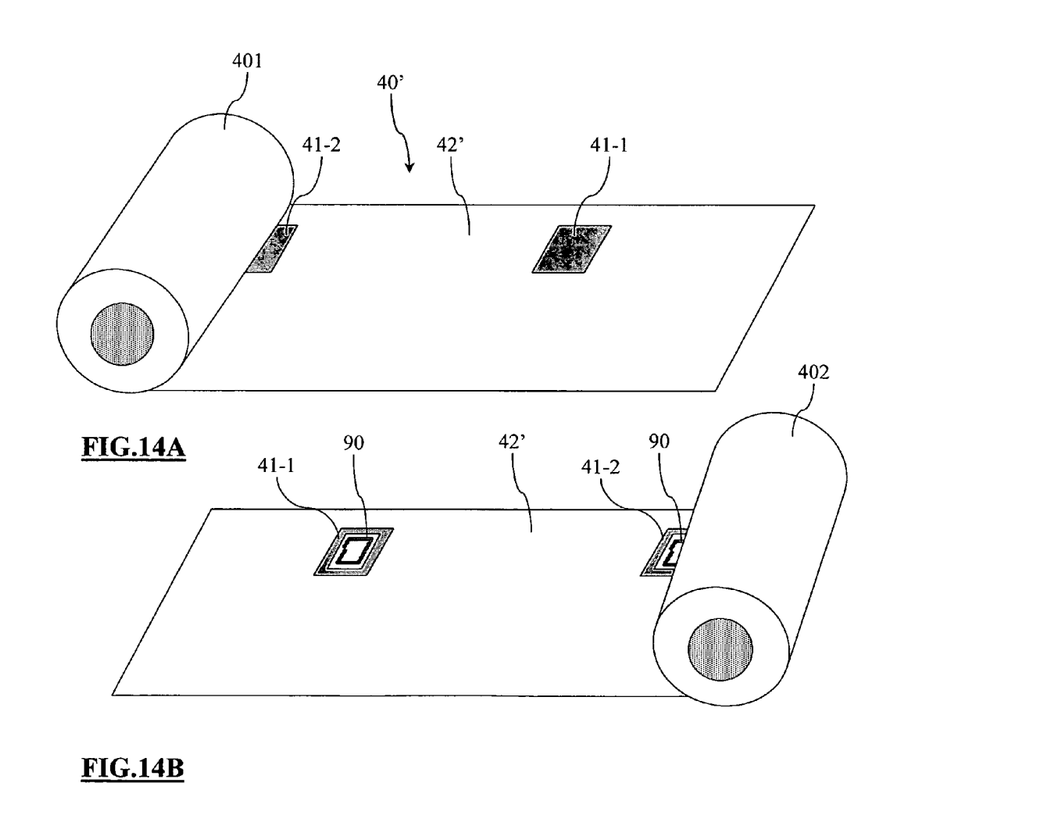
FIGS. 14A, 14B represent a packaging foil packed as a roll respectively before and after implementation of a variation of the method shown in FIG. 11.
Figure 15:
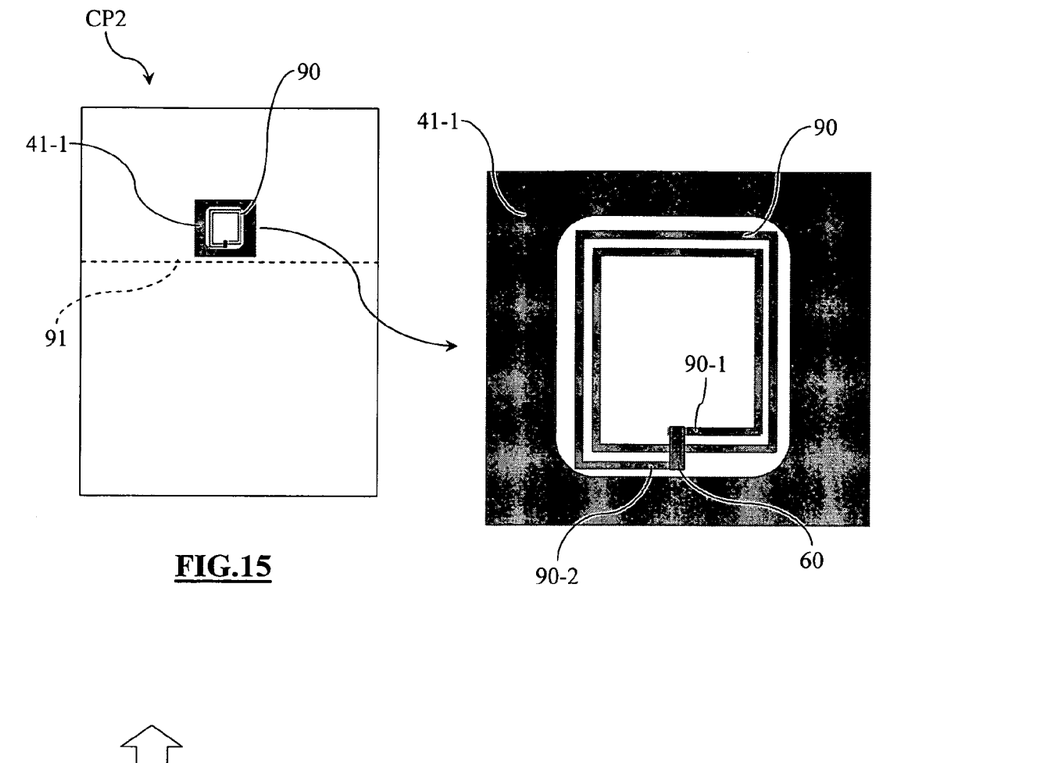
FIG. 15 is a front view of a cigarette packet packaged in the packaging foil in FIG. 14B.

FIGS. 14A and 14B show an alternative of the second method of the present invention. Here, the initial roll 401 is formed by a packaging foil 40' that is not entirely covered with the aluminum film 41. The latter forms metallized regions 41-1, 41-2 . . . that are thus insulated from each other due to the absence of any metal material between these regions. The aluminum film 41 is borne by a plastic film 42' that is preferably thicker than the binder film 42 used to produce the blisters. The final roll 402, represented in FIG. 14B, has antenna coil patterns 90 as above but these are produced by removing the aluminum in the regions 41-1, 41-2 only. A cigarette packet CP2 packaged by the foil 40' is represented in FIG. 15. An integrated circuit 60 is fixed to the antenna coil 90 according to the method described above (FIG. 9B).

Figure 16:
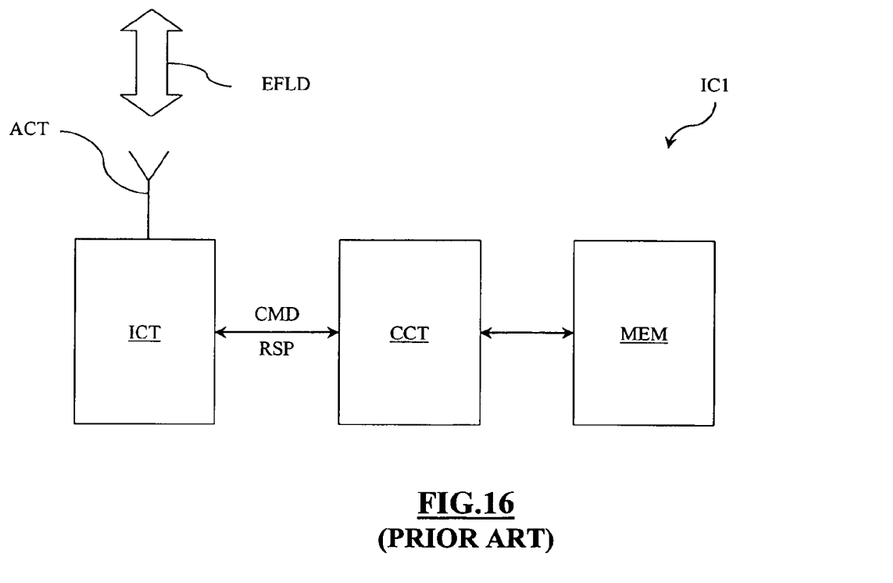
FIG. 16 is a block diagram representing the architecture of a contactless integrated circuit in accordance with the prior art.

FIG. 16 represents in block form, as an example, the classic architecture of a contactless integrated circuit IC1. The integrated circuit comprises an antenna circuit comprising an antenna ACT, such as a UHF-type antenna, a contactless interface circuit ICT connected to the antenna ACT, a hardwire logic or microprocessor control circuit CCT, and a memory MEM, such as an electrically erasable and programmable-type memory (EEPROM) for example. The control circuit CCT receives via the interface circuit ICT read or write commands CMD for reading or writing the memory, and anti-collision commands and possibly authentication commands (if it is equipped with an encryption function). The interface circuit ICT comprises a demodulation circuit for demodulating an antenna signal induced in the antenna ACT by an electric field (or by a magnetic field when the antenna is a coil type antenna), and a decoding circuit for decoding data from the antenna circuit. The circuit ICT also comprises a modulation circuit for modulating the impedance of the antenna circuit. The antenna circuit comprises the antenna ACT and other components (capacitors and/or self capacitors) not represented in the figure, which can be integrated into the silicon chip bearing the integrated circuit or be arranged outside the latter.

It will be understood by those skilled in the art that various other alternative embodiments of the present invention are possible. For example, a greater number of antennas can be provided on the packaging foil so that the packaged product has antennas on several of its sides and/or several antennas on one of its sides. The methods for removing metal material by mechanical or chemical action described above enable complex conductive patterns to be produced and enable, for example, the connecting point of the integrated circuit to be made at a location different from the one on which the antenna is situated. Thus, pads of the chip can be provided at a location different from the one on which the antenna is situated, and be linked to the antenna by conductors formed in the aluminum film in the same way as the antenna is formed, i.e., by removing metal material. This allows, for example, the integrated circuit to be mounted on a side of the packaged item that is different from the side receiving the antenna, so that the chip is not visible when the product is displayed for sale. This also allows the electronic tag to be destroyed or disabled by providing a pre-cut line for the packaging passing through the conductor linking the antenna to the integrated circuit.

Various applications of the present invention may also be made. Generally speaking, it can be applied to any flexible, semi-rigid or even rigid product packaging, packing or transport foil comprising an electrically conductive film. These include trays for consumable substances, transport bags of various items, food bags, particularly frozen food bags, advertising labels comprising metal parts, bottles comprising a metal film (fresh fruit juice, milk), etc. As aluminum films are frequently used in the food industry, they enable antennas according to the present invention to be produced at low cost. Moreover, the present invention can be applied to most types of packaging or packing foil comprising an electrically conductive film initially provided for purposes other than the production of an RFID antenna, such as antistatic conductive layers, copper films, or films in sintered metal powder, in alloy, etc. Although some of these applications do not enable an antenna to be produced that can easily be destroyed by the user, they are within the scope of the present invention. The production of a destroyable antenna is only one optional object of the present invention concerning certain categories of applications.

In the examples above and in the claims, the conductive film is not covered on one of its faces by an electrically insulating film, which enables the antenna according to the present invention to be produced and then the contactless integrated circuit to be connected to it. Thus, this feature according to which the metal film is not covered by an electrically insulating film so that the metal film used by the present invention is not fully sandwiched between dielectric materials, particularly at the time the antenna is produced. But this does not preclude subsequently disposing a protective insulator on the integrated circuit and/or on the antenna, as is the case with the protective layer 64 disposed on the interposer described above in relation with FIG. 6.

That which is claimed is:

1. A method for manufacturing an electronic tag to be affixed onto a blister-type strip comprising:

forming, in an electrically conductive film of a foil for packaging, packing or transporting the blister-type strip, areas devoid of any electrically conductive material for delimiting in the electrically conductive film at least one antenna pattern for forming an antenna for an RFID tag, the foil including an electrically insulating film on the electrically conductive film, the electrically conductive film not being covered on one of its sides by the electrically insulating film, the areas devoid of any electrically conductive material defining a plurality of substantially parallel bands passing through a medial portion of the blister-type strip; and connecting to the antenna a semiconductor chip for forming the electronic tag.

2. A method according to claim 1, wherein the foil further comprises at least one electrically insulating backing film at least partially covered by the electrically conductive film.

3. A method according to claim 2, wherein forming the areas devoid of any electrically conductive material comprises at least one of abrasion and cutting the electrically conductive film.

4. A method according to claim 3, wherein at least one of the abrasion and cutting of the electrically conductive film is carried out after application of the foil to the blister-type strip; and further comprising forming grooves on one side of the blister-type strip opposite the areas where the electrically conductive material has been removed by abrasion or cutting.

5. A method according to claim 1, wherein the foil is applied to one side of the blister-type strip with the electrically conductive film facing outwards.

6. A method according to claim 1, wherein the electrically conductive film comprises a metal film.

7. A method for manufacturing a blister-type packaging comprising:

forming a strip in plastic layer comprising a plurality of cells;

forming a packaging foil comprising at least one electrically insulating backing film, and a metal film covering at least a portion of the electrically insulating backing film;

closing the plurality of cells by applying the packaging foil to the strip with the metal film facing outwards; and forming, in the metal film, areas devoid of any metal material for delimiting in the metal film at least one antenna pattern for forming an antenna for an RFID tag, the areas devoid of any metal material defining a plurality of substantially parallel bands passing through a medial portion of the blister-type package.

8. A method according to claim 7, wherein forming the areas devoid of any metal material comprises at least one of abrasion and cutting the metal film after the closing of the plurality of cells.

9. A method according to claim 8, further comprising forming grooves on the strip opposite the areas where the metal material is to be removed by at least one of the abrasion and cutting.

10. A method according to claim 7, further comprising connecting to the antenna a semiconductor chip to form an electronic tag.

11. A method for packaging or packing a blister-type strip using a packaging or packing foil comprising an electrically conductive film, the method comprising:

forming in the electrically conductive film, areas devoid of any electrically conductive material for delimiting in the electrically conductive film at least one antenna pattern for forming an antenna for an RFID tag, the areas devoid of any electrically conductive material defining a plurality of substantially parallel bands passing through a medial portion of the blister-type strip.

12. A method according to claim 11, wherein the electrically conductive film is not covered on one of its sides by an electrically insulating film.

13. A method according to claim 11, wherein the packaging or packing foil comprises at least one electrically insulating backing film at least partially covered by the electrically conductive film.

14. A method according to claim 11, further comprising applying the packaging or packing foil to at least a portion of the product so that the electrically conductive film faces outwards.

15. A method according to claim 11, wherein the conductive film comprises a metal film.

16. A method according to claim 11, wherein forming the areas devoid of any electrically conductive material comprises at least one of abrasion and cutting the electrically conductive film after application of the packaging or packing foil to the blister-type strip.

17. A method according to claim 11, further comprising connecting to the antenna a semiconductor chip to form an electronic tag.

18. A method according to claim 17, wherein the packaging, packing or transport foil comprises at least one electrically insulating backing film at least partially covered by the electrically conductive film.

19. A method according to claim 17, wherein the packaging, packing or transport foil is produced so that the electrically conductive film faces outwards.

20. A method according to claim 17, wherein the electrically conductive film comprises a metal film.

21. A method for manufacturing a blister-type strip packaging, packing or transport foil, with the foil comprising an electrically conductive film, the method comprising:

forming, in the electrically conductive film, areas devoid of any electrically conductive material for delimiting in the electrically conductive film at least one antenna pattern for forming an antenna for an RFID tag, the areas devoid of any electrically conductive material defining a plurality of substantially parallel bands passing through a medial portion of the blister-type strip.

22. A method according to claim 21, wherein the electrically conductive film is not covered on one of its sides by an electrically insulating film.

* * * * *